United States Patent
Tamatsuka

(10) Patent No.: US 6,802,899 B1
(45) Date of Patent: Oct. 12, 2004

(54) SILICON SINGLE CRYSTAL WAFER AND MANUFACTURING PROCESS THEREFOR

(75) Inventor: Masaro Tamatsuka, Annaka (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 394 days.

(21) Appl. No.: 09/868,901
(22) PCT Filed: Oct. 31, 2000
(86) PCT No.: PCT/JP00/07641
§ 371 (c)(1),
(2), (4) Date: Jul. 9, 2001
(87) PCT Pub. No.: WO01/34882
PCT Pub. Date: May 17, 2001

(30) Foreign Application Priority Data

Nov. 11, 1999 (JP) ............................................ 11-320507

(51) Int. Cl.[7] .............................................. C30B 15/14
(52) U.S. Cl. .............................. 117/13; 117/15; 117/19; 117/20; 117/21; 117/935
(58) Field of Search .............................. 117/13, 15, 19, 117/20, 21, 935

(56) References Cited

U.S. PATENT DOCUMENTS 6,113,687 A * 9/2000 Horai et al. .................. 117/20
6,245,430 B1 * 6/2001 Hourai et al. ................ 428/450
6,416,576 B1 * 7/2002 Mizuta et al. ................ 117/20
6,517,632 B2 * 2/2003 Minami et al. ............... 117/19
6,547,875 B1 * 4/2003 Nakajima et al. ............. 117/13

FOREIGN PATENT DOCUMENTS

JP           11-199385        *   7/1999

OTHER PUBLICATIONS

Abstract of Japanese Patent Publication No. 11195565A; dated Jul. 21, 1999.
"Dynamic Behavior of Intrinsic Point Defects in FZ and CZ Silicon Crystals," Mat. Res. Soc. Symp. Proc. vol. 262, 1992 Materials Research Society, ABE et al., pp. 3–13.

* cited by examiner

Primary Examiner—Robert Kunemund
(74) Attorney, Agent, or Firm—Arent Fox PLLC

(57) ABSTRACT

There is provided a manufacturing process for a CZ silicon single crystal wafer which is subjected to heat treatment wherein slip resistance of a portion of the CZ silicon single crystal wafer in contact with a heat treatment boat is improved with extreme simplicity, convenience and very low cost. A silicon single crystal rod is grown by means of a Czochralski method in a condition that an OSF ring region is formed in a peripheral region of the silicon single crystal rod and the grown silicon signal crystal rod is processed into silicon single crystal wafers, whereby the silicon single crystal wafer is obtained such that when the silicon single crystal wafer is subjected to heat treatment, at least a portion of the silicon single crystal wafer in contact between the wafer and the boat is formed of an OSF ring region.

8 Claims, 5 Drawing Sheets

(a)

(b)

(a)

(b)

(a) nitrogen doped, with OSF about 10 mm (b) nitrogen undoped, with OSF about 10 mm (c) nitrogen doped, without OSF

SILICON SINGLE CRYSTAL WAFER AND MANUFACTURING PROCESS THEREFOR

TECHNICAL FIELD

This invention relates to a silicon single crystal wafer and a manufacturing process therefor, and particularly, to a silicon single crystal wafer capable of suppressing growth of slip dislocations easily generated in a heat treatment step and a manufacturing process therefor.

BACKGROUND ART

An integrated circuit such as LSI has been fabricated mainly starting with a silicon single crystal wafer prepared by means of a pulling method called Czochralski method (CZ method) through many production steps. As one of the production steps, there exists a heat treatment step. There is very important the heat treatment step where, for example, oxide film formation on a wafer surface, impurity diffusion, formation of a defect free layer and a gettering layer and others are performed.

There are known two types of furnaces, vertical and horizontal, as a so-called batch type resistance heating heat treatment furnace which is used in the heat treatment step, and capable of heat treating many wafers at one time. The horizontal furnace is to heat treat wafers which are vertically placed on a jig called a boat for holding them and inserted into the interior thereof. The vertical furnace is to heat treat wafers which are horizontally placed on a boat and inserted into the interior thereof.

One of problems in the heat treatment step is generation of slip dislocations. A slip dislocation means a defect having a stepwise profile created on a wafer surface by slip deformation in crystal due to a thermal stress during the heat treatment step. When such slip dislocations generate on a wafer surface, not only a mechanical strength is reduced, but device characteristics such as junction leakage are adversely affected; therefore, it is desired to reduce slip dislocations to the lowest possible level.

When heat treatment is conducted using the batch type heat treatment furnace as described above, temperature distribution is generated in a wafer during loading it into and unloading it from the furnace or during raising or lowering a furnace temperature, which causes a stress in the wafer due to the temperature distribution. Further, when this stress exceeds a critical value, a slip dislocation generates. In this case, since a wafer is placed on a boat, the wafer weight is apt to be concentrated at a contact portion with the boat, which causes a bigger stress acting on the contact portion and easier generation of slip dislocations. Especially, when a wafer is of a larger diameter, the wafer weight becomes bigger and influences greatly.

On the other hand, there is also a case where, in the heat treatment step, an RTA (Rapid Thermal Annealing) apparatus is employed, which is a single wafer heat treatment furnace using lamp heating or the like, in addition to the above described batch type heat treatment furnace. In the case of an apparatus of this kind, since the furnace is a single wafer processing type and a temperature up and down rate is very fast and temperature distribution in a wafer is harder to occur compared with the batch type heat treatment furnace, the furnace is useful in heat treatment of a large diameter wafer, but there is a phenomenon that slip dislocations are easy to occur at a contact portion with a jig on which wafers are placed because a stress due to the wafer weight is concentrated to the contact portion, which is similar to the case of the batch type heat treatment furnace.

In order to suppress slip dislocations generated in such a way, remedies have been mainly studied from two viewpoints in the prior art. An approach from one viewpoint is to reduce a stress imposed on a contact portion between a wafer and a boat, wherein the concentration of a stress is alleviated by improving a shape of the boat. For example, a technique disclosed in JP-A-97-251961 is such that an angle of the wafer placing portion of the boat for a vertical furnace heat treatment is held is set so as to be in conformity with deformation thereof caused by the wafer weight, and thereby a contact portion between the wafer and the boat is altered from a condition of a point contact to a plane contact, with the result that concentration of a stress is prevented.

Another approach is to reduce temperature distribution in a wafer generated in a heat treatment step by improving a heating condition. For example, a technique disclosed in JP-A-95-235507 is such that hydrogen or helium having higher thermal conductivity than nitrogen or argon which is usually used during raising and lowering temperature in a heat treatment step is employed to encourage thermal conduction to a wafer so as to reduce a temperature difference in a wafer surface. Also, a proposal has been made in JP-A-95-312351 that generation of slip dislocations is prevented by reducing a temperature rise/fall rate with a rise in temperature.

As approaches from the two viewpoints, not limited to the above described examples, many others are known. While all the above described approaches have some level of effectiveness for suppressing slip dislocations in a heat treatment step, they are not necessarily perfect as remedies for all of a variety of heat treatment steps and furthermore, some of them are not practical in cost problems.

On the other hand, in addition to approaches from the above described two viewpoints to suppress generation of slip dislocations, one attempt has been tried very recently in which characteristics of a wafer itself are improved to make slip resistance better. For example, in JP-A-97-227290 there is proposed a wafer in which an oxygen concentration in the peripheral region is not less than 95% of that in the middle on the basis of observation that a silicon single crystal wafer prepared from a single crystal rod grown by means of a CZ method has a lower oxygen concentration in the peripheral region than in the middle, which is a cause for generation of slip dislocations. A manufacturing process for such a wafer is disclosed in the publication in which a single crystal rod of a diameter larger than that of a product wafer by 10 mm or more is pulled and the single crystal is ground off to a target diameter.

Further, description is found in JP-A-97-190954 that in a CZ wafer of a low oxygen concentration generation of slip dislocations is suppressed when polyhedral oxide precipitates are formed at a prescribed density in a region with a width of 10 mm or less from the periphery where slip dislocations are generated with ease.

Furthermore, in order to generate the oxide precipitates at the prescribed density, the publication discloses a technique in which oxygen is ion-implanted in the region with a width of 10 mm or less from the periphery, and two stage heat treatment is carried out in a nitrogen atmosphere.

However, since the techniques described above are to improve characteristics of a wafer itself, an effect may be obtained in all the heat treatment steps, but any of them lacks practical use due to insufficient simplicity and cost performance. That is, in the technique disclosed in JP-A-97-227290, a loss of a silicon single crystal rod increases and further an extra time required for processing becomes necessary, and in JP-A-97-190954, additional steps of ion implantation and two stage heat treatment are required.

The invention has been made in light of the above described problems and it is accordingly an object of the invention to provide a CZ silicon single crystal wafer to be subjected to a heat treatment step which has improved slip resistance of a portion in contact with a heat treatment boat by using a manufacturing process with extreme simplicity, convenience, and very low cost.

DISCLOSURE OF THE INVENTION

In order to achieve the object, a silicon single crystal wafer of the invention is a wafer prepared by means of a Czochralski method, and characterized in that when the silicon single crystal wafer is placed on a boat for heat treatment, at least a portion of the silicon single crystal wafer in contact with the boat is formed of an OSF ring region. When a silicon single crystal wafer has a portion formed of the OSF ring region in contact with the boat, growth of a slip dislocation is confined within the interior (the bulk portion) of the wafer, if the slip dislocation generates at the contact portion; therefore, no slip dislocation extends to the wafer surface and no influence is exerted on a device region in the surface side of the wafer.

Furthermore, the OSF ring region is preferably an annular region with a width of 10 mm or less from a periphery of a silicon single crystal wafer. This is because if the OSF ring region expands inward up to a distance more than 10 mm from the periphery, a useful area in which characteristically excellent devices can be fabricated is reduced, leading to a case where a sufficient number of product devices cannot be ensured. In case of a vertical furnace, since the contact portion between the wafer and the boat is located at about 8 mm at most from the periphery of the wafer, the OSF ring located at about 10 mm from the periphery is effective for suppressing growth of the slip dislocation. On the other hand, in case of a horizontal furnace, since the contact portion between the wafer and the boat is at about 3 mm at most from the periphery, the OSF ring located even at about 5 mm from the periphery is still effective for suppressing growth of the slip dislocation.

Moreover, a nitrogen concentration in a silicon single crystal wafer is preferably in the range of $1\times10^{10}$ to $5\times10^{15}/cm^3$. A wafer including nitrogen in such a content is more effective for suppressing growth of slip dislocations since sizes of oxide precipitates decrease and a density thereof increases due to effects of nitrogen.

Also, a nitrogen concentration is desirably $1\times10^{10}/cm^3$ or more in order to increase a density of oxide precipitates, and preferably $5\times10^{15}/cm^3$ or less in order not to hinder crystallization of a silicon single crystal, but more preferably in the range of $1\times10^{12}$ to $1\times10^{15}/cm^3$ in terms of suppression of slip dislocations.

In order to produce such a silicon single crystal wafer, a manufacturing process for a silicon single crystal wafer of the invention is characterized in that a silicon single crystal rod is grown by means of a Czochralski method in a condition that an OSF ring region is formed in a peripheral region of the silicon single crystal rod and the silicon signal crystal rod obtained is sliced into silicon single crystal wafers.

A detailed pulling condition can be such that when a pulling rate is indicated by F [mm/min] and an average temperature gradient in a pulling direction in a length between points corresponding to a silicon melting point and 1400° C. in the crystal is indicated by G [° C./mm] by definition, there is present in a peripheral region of the crystal, an OSF ring region of a defect distribution chart showing defect distribution with an abscissa representing a distance [mm] in a direction to the crystal periphery from the center and an ordinate representing a value of F/G [mm²/° C.·min].

Moreover, when a silicon single crystal rod is grown by means of the Czochralski method, if the silicon single crystal rod is pulled while doping with nitrogen at a concentration in the range of $1\times10^{10}$ to $5\times10^{15}/cm^3$, a silicon single crystal wafer doped with nitrogen at a concentration in the range of $1\times10^{10}$ to $5\times10^{15}/cm^3$ can be produced.

BEST MODE FOR CARRYING OUT THE INVENTION

Description will be given of embodiments of the invention below. The inventor of the invention has investigated into slip dislocations in a silicon single crystal wafer prepared from a silicon single crystal rod pulled under various pulling conditions, generated mainly from a contact portion between a boat and the silicon single crystal wafer when the silicon single crystal wafer is subjected to heat treatment. The investigation has uncovered the fact that a wafer whose contact portion with a boat is included in an OSF ring region has low generation of slip dislocations and a slip dislocation thus generated, if any, does not extend to a wafer surface which is the surface of the side opposite to the contact portion. Based on this finding, the present inventor has completed the present invention.

Here, description will be given of an OSF ring region.

A CZ wafer prepared from a silicon single crystal rod pulled by means of a CZ method is subjected to oxidation and then, defects called OSF (Oxidation-Induced Stacking Fault) are sometimes generated in the form of a ring. This region is called an OSF ring region. It is assumed that fine oxide precipitates (about 30 nm) which are introduced in this region during crystal growth work as nuclei and interstitial silicon atoms aggregate on the nuclei to form OSF to be observed during subsequent oxidation treatment.

Figure 3:
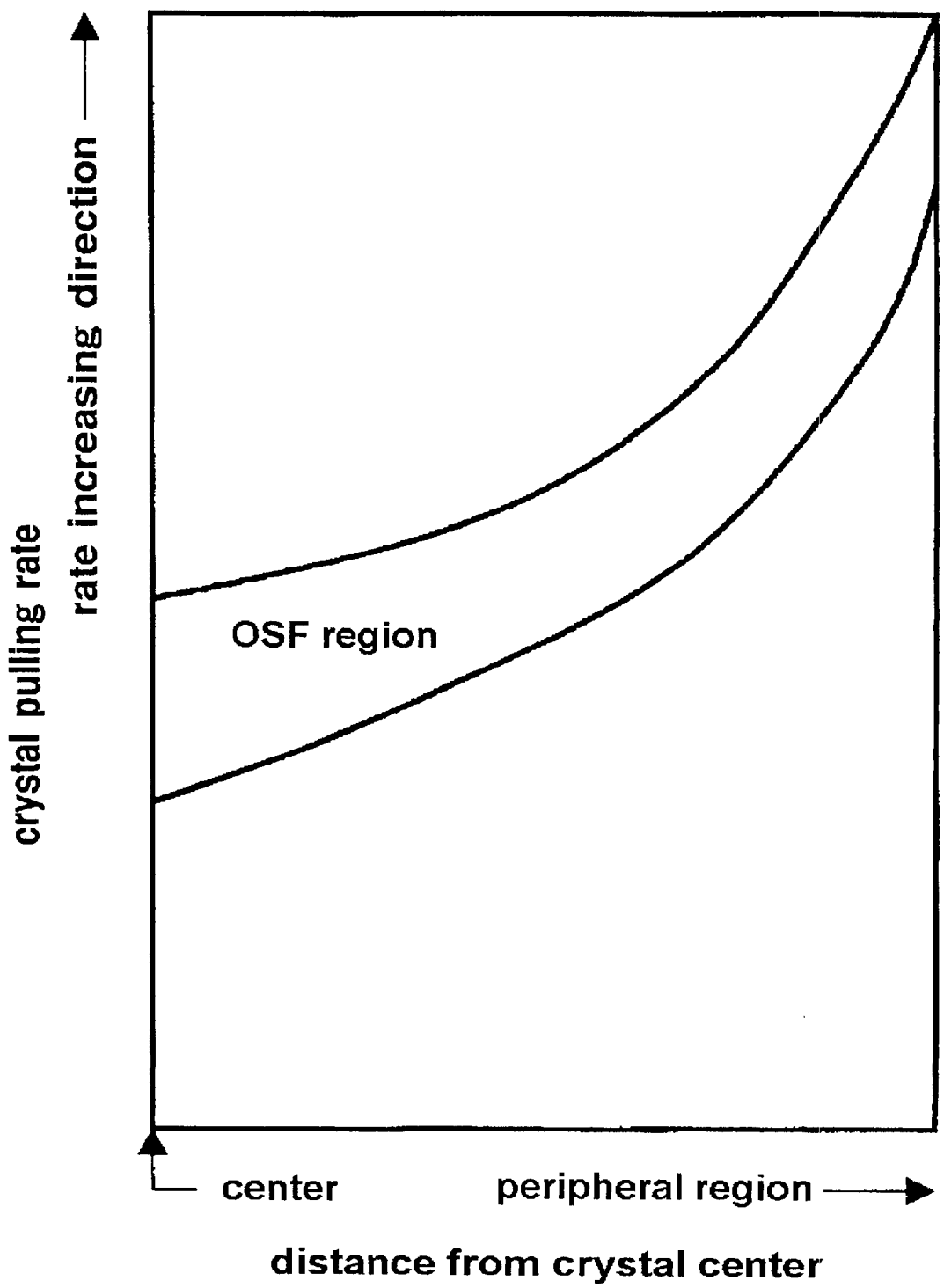
FIG. 3 is a chart schematically showing the state of generation of an OSF ring region at different pulling rate of crystals.

FIG. 3 is a chart schematically showing the state of generation of an OSF ring region at different pulling rates of crystals. According to FIG. 3, it is found that as a pulling rate is reduced, a ring diameter decreases and with further reduction in the pulling rate, the ring disappears at the center of the crystal (Shinoyama, et al., Applied Physics, Vol. 60, No. 8 (1991) pp. 766 to 773).

Therefore, the state of generation of an OSF ring region is dependent on a crystal growth condition, from which it is understood that if a crystal growth condition is controlled, an OSF ring region can be formed in a desired position.

Figure 4:
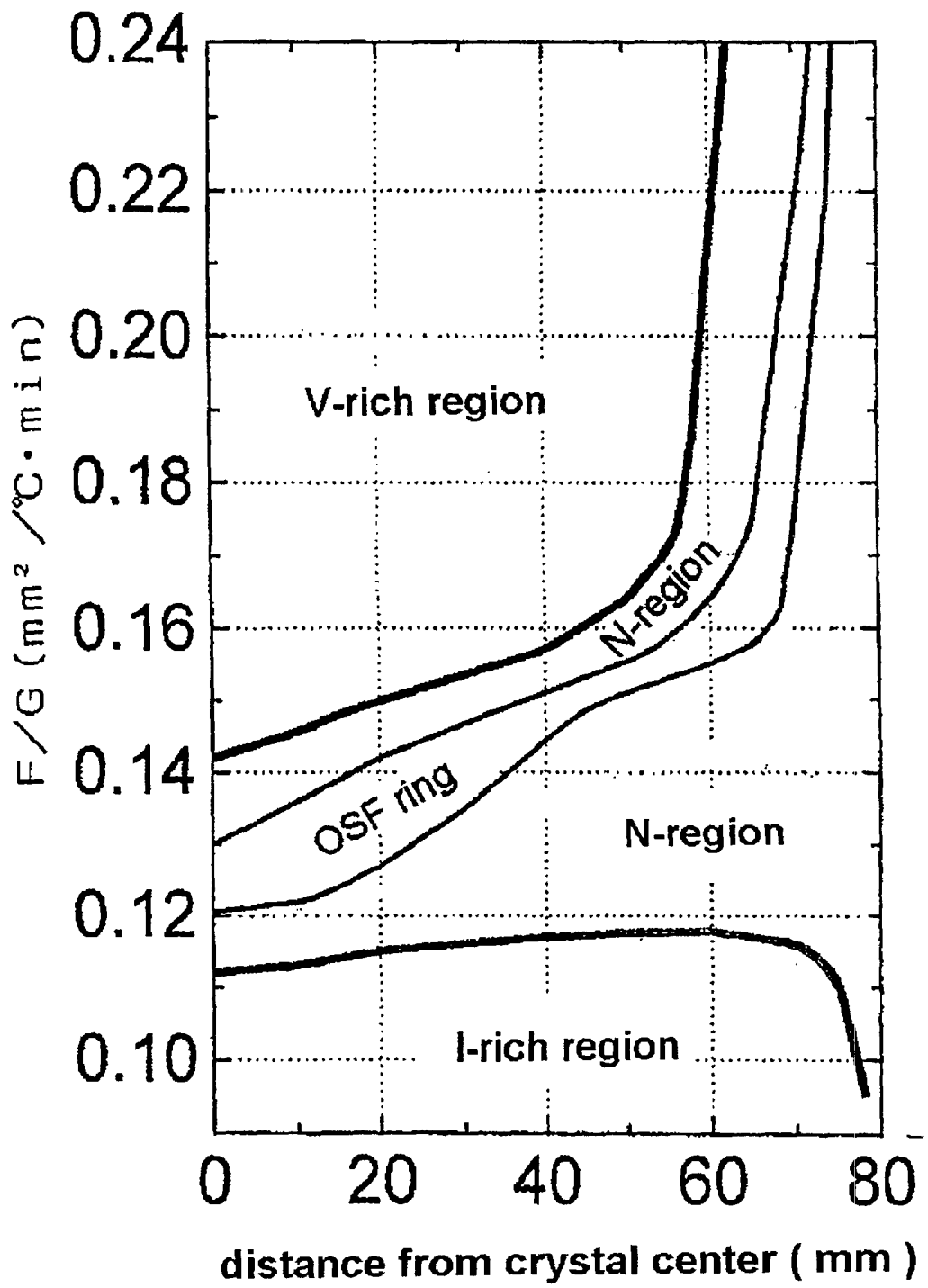
FIG. 4 is a defect distribution chart with an abscissa representing a distance in a direction to the crystal periphery from the center and an ordinate representing a value of F/G when a silicon single crystal of the invention is pulled.

Note that it is confirmed according to a most recent research that in the upper and lower parts sandwiching the OSF region therebetween in FIG. 3 (inner and outer parts of the OSF region), there are regions called N-regions in which no or very few crystal defects caused by vacancies and interstitial silicon atoms are present (JP-A-99-147786). Besides, the further inside of the N-region inside of the OSF region (a higher pulling rate side in the chart) is called a V-rich region, rich in defect caused by vacancies, and the further outside of the N-region outside of the OSF region (a lower pulling rate side in the chart) is called an I-rich region, rich in defect caused by interstitial silicon atoms (FIG. 4).

Figure 1:
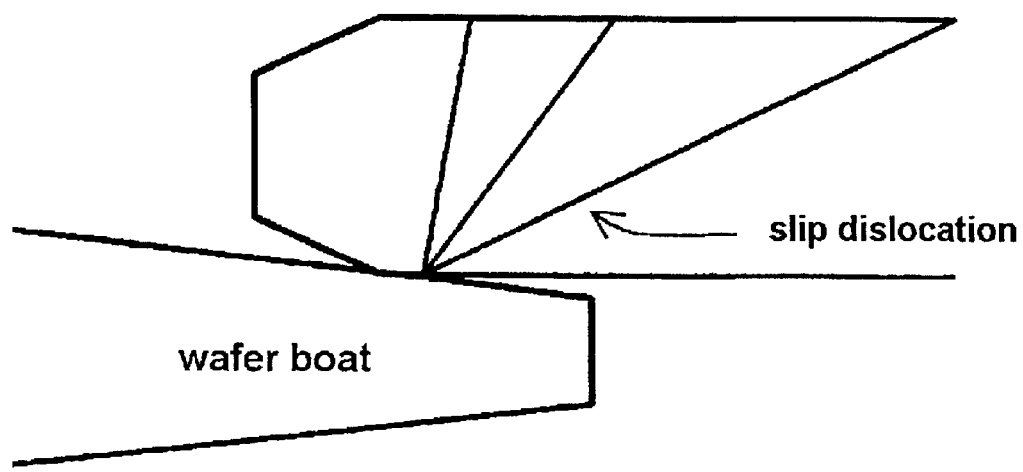
FIGS. 1(a) and 1(b) are sectional views schematically showing the state of generation of slip dislocations in a contact portion between a wafer of the invention and a boat.
Figure 1:
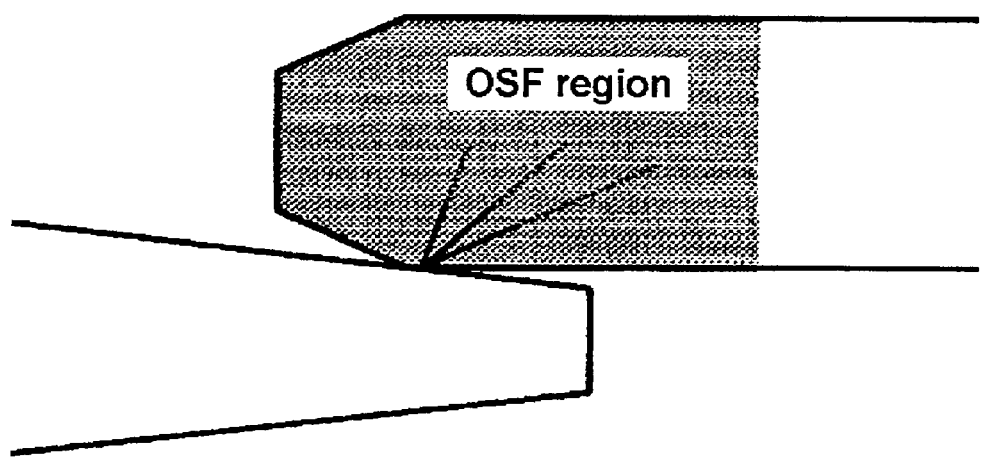

FIG. 1 is to simply express a concept of the invention, where schematically shown is the state of generation of slip dislocations at a contact portion between a wafer and a boat.

FIG. 1(a) shows a case of a wafer having no OSF region, wherein slip dislocations generated at the contact portion extend to a wafer surface. On the other hand, FIG. 1(b) shows a case where a contact portion resides in an OSF ring region, wherein even when slip dislocations occur, none of the slip dislocations extend to a wafer surface. While FIG. 1 shows a case of a vertical furnace, in case of a horizontal furnace as well, growth of slip dislocations is effectively suppressed when a contact portion between a wafer and a boat resides within an OSF region.

It is not clear the reason why slip dislocations are hard to be generated in an OSF regions or growth of slip dislocations is confined within the interior of a wafer and thereby the dislocations are hard to reach a wafer surface side, but since it is said that fine oxide precipitates serving as OSF nuclei reside in the OSF region as described above and interstitial silicon atoms are excessively included throughout all of the region (Takao Abe, Silicon-Crystal Growth and Wafer Processing, Baifu Kan, p. 296), it is considered that oxide precipitates and silicon interstitial atoms take part in the above phenomenon.

Further, it is also known that when nitrogen is doped into a silicon single crystal, effects arise that aggregation of atomic vacancies in silicon is suppressed to reduce sizes of crystal defects and that oxygen precipitation is accelerated. Therefore, it is considered that when the OSF region is formed in a peripheral region of a wafer with nitrogen doping, a density of fine oxide precipitates serving as OSF nuclei can be increased in the peripheral region, thereby enhancing an effect of suppressing slip dislocations.

Figure 5:
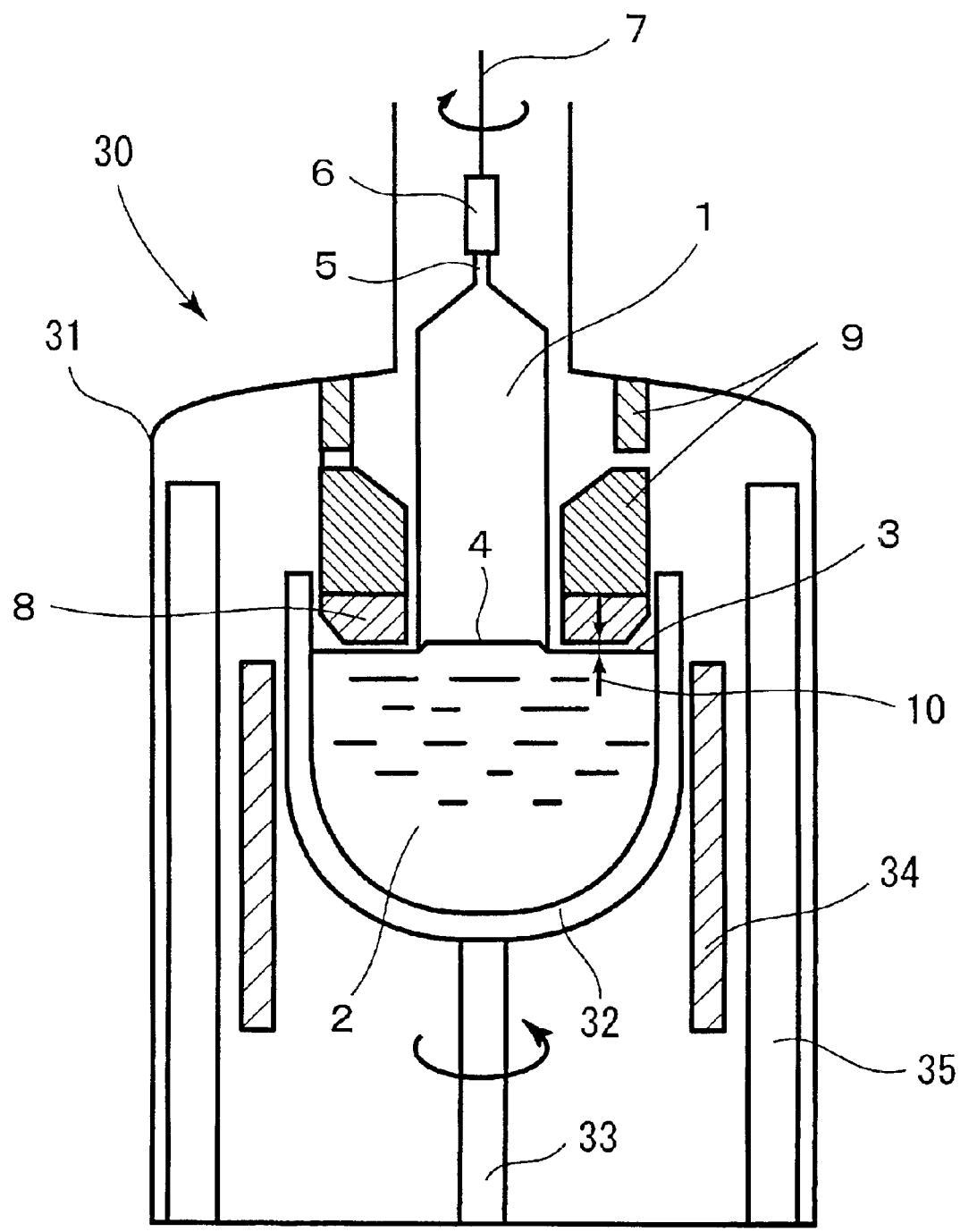
FIG. 5 is a schematic and descriptive view of a single crystal pulling apparatus of a CZ method used in the invention.

Next, description will be given of an exemplary structure of a single crystal pulling apparatus of a CZ method used in the invention with reference to FIG. 5. As shown in FIG. 5, the silicon single crystal pulling apparatus 30 includes: a pull chamber 31; a crucible 32 placed in the pull chamber 31; a heater 34 surrounding the crucible 32; a crucible support shaft 33 rotating the crucible 32 and a rotation mechanism therefor (not shown); a seed chuck 6 holding a silicon seed crystal 5; a wire 7 pulling up the seed chuck 6; and a take-up mechanism (not shown) rotating or winding up the wire 7. The crucible 32 is provided with a quartz crucible in the inner side which contains a silicon melt 2 and a graphite crucible in the outer side. Furthermore, the heater 34 is surrounded with a heat insulating member 35.

Besides, in order to set manufacturing conditions relating to a manufacturing process of the invention, a solid/liquid interface heat insulating member 8 of an annular shape surrounds the solid/liquid interface of the crystal and a top surrounding heat insulating member 9 is further provided thereon. The solid/liquid interface heat insulating member 8 is disposed above a silicon melt 2 with a gap 10 of 3 to 5 cm between the low end thereof and a melt surface 3. The top surrounding heat insulating member 9 is not used on certain pulling conditions. Moreover, there may be provided a cylindrical cooling apparatus (not shown) for cooling the single crystal by blowing cooling gas or shielding the radiant heat.

In recent years, there has also been employed in many cases a so-called MCZ method where magnets (not shown) have been disposed outside the pull chamber 31 in the horizontal direction and by applying a magnetic field with a horizontal direction, a vertical direction or other directions to the silicon melt 2, convection of the melt is suppressed to ensure stable growth.

Next, description will be given of a method for growing a single crystal using the single crystal pulling apparatus 30.

A high purity polycrystalline silicon starting material is melted in the crucible 32 by heating the material at the melting point thereof (about 1420° C.) or higher. At this time, in a case where nitrogen is doped, for example a silicon wafer or wafers each formed with a nitride film thereon is put into the crucible 32 in advance. Then, by reeling out the wire 7, a tip end of the seed crystal 5 is put into contact with or dipped into the silicon melt 2 almost at the center of the surface of the melt 2. Subsequent to this, not only the crucible support shaft 33 is rotated in a proper direction, but the wire 7 is also wound up while rotating, with the result that the seed crystal is pulled up, whereby growth of a single crystal gets started. Thereafter, the single crystal rod 1 of an almost cylindrical shape can be obtained by properly adjusting a pulling rate and temperature.

In the invention, pulling conditions are so adjusted that a region called OSF ring region described above is formed in a peripheral region of the silicon single crystal rod 1. For example, in case of using a specific furnace structure such as a generating position of an OSF ring region can be controlled by altering a pulling rate of the single crystal as shown in FIG. 5, the pulling rate may be controlled so as to generate the OSF region in a peripheral region of the single crystal. The OSF region preferably covers in an annular region with a width of 10 mm or less from the periphery of the wafer.

However, in order to stably generate an OSF ring region only in the peripheral region of a crystal simply by only controlling a pulling rate, strict control of the pulling rate comes to be required. Therefore, when a furnace structure is adjusted by using a heat insulating member or a cooling apparatus to control a temperature gradient in the vicinity of a solid/liquid interface of a pulling crystal, a generation distribution of an OSF region in FIG. 3 can be altered. In such a case, when as in the case of FIG. 4, a pulling rate is indicated by F [mm/min], there is indicated by G [° C./mm] an average temperature gradient of the crystal in a pulling direction in a length between points corresponding to a silicon melting point and 1400° C., and a value of F/G [mm$^2$/° C.·min] is used as a parameter, conditions under which an OSF ring region is formed in the peripheral region of a crystal can be controlled with a sufficient control margin.

When a single crystal rod is pulled such that an OSF ring region resides in the peripheral region of the single crystal rod as stated above and thus obtained rod is processed by means of an ordinary wafer process, there are obtained wafers each having an OSF ring region in a wafer peripheral region in which a contact between the wafer and a boat is easy to occur in a heating process.

That is, since there can be obtained wafers capable of suppressing generation of slip dislocations only by controlling a generating position of an OSF ring region during crystal pulling, the manufacturing process is very effective for reducing a cost without a need for an increase in processing loss and the number of additional steps.

Concrete description will be given of embodiments of the invention below taking up examples, but it should be understood that the invention is not limited to the examples.

EXAMPLE 1

With the pulling apparatus 30 shown in FIG. 5, a starting material polycrystalline silicon was charged in a 20 inch quartz crucible to pull a p-type silicon single crystal rod with a <100> orientation and a diameter of 6 inches. In this case, a F/G value in the central portion of the crystal was controlled in the range of 0.25 to 0.33 mm$^2$/° C.·min to form an OSF ring region in an annular region with a width of about 10 mm or less from the periphery of the crystal. Furthermore, control was performed such that a nitrogen concentration in the pulling crystal fell in the range of $5 \times 10^{13}$ to $1 \times 10^{14}$/cm$^3$, based on the calculation, by adding wafers each formed with a silicon nitride film into the starting substance polycrystalline silicon.

Figure 2:
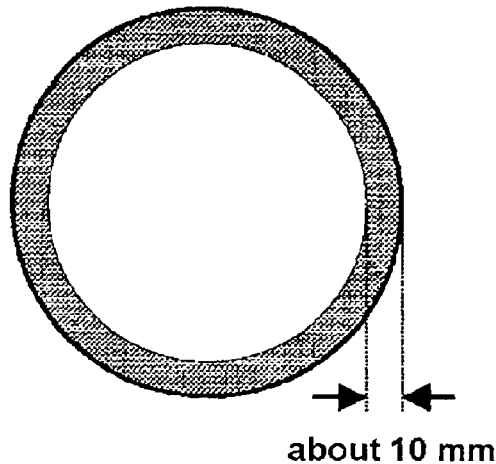
FIGS. 2(a–c) is schematic drawings showing results of X ray topography in Examples and Comparative Examples of the invention.
Figure 2:
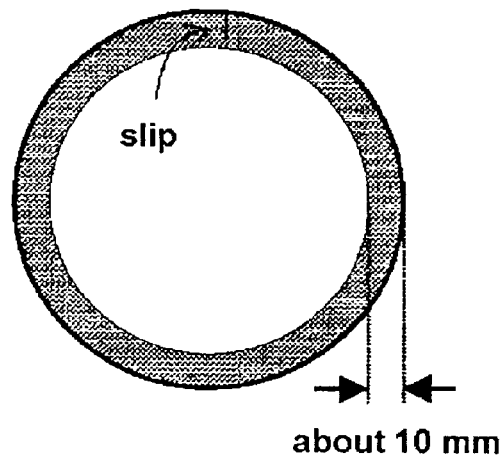
Figure 2:
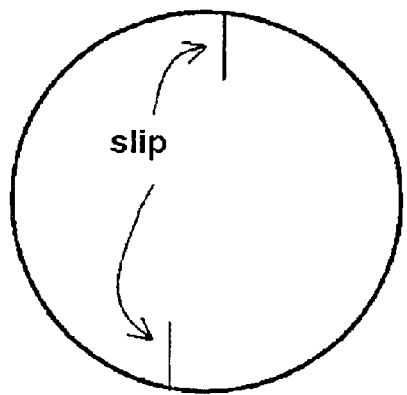

Wafers were cut from the single crystal obtained here and an ordinary wafer process was applied to prepare mirror polished wafers. The mirror polished wafers were inserted into a vertical furnace to perform heat treatment on the wafers in an argon atmosphere at 1150° C. for one hour, followed by further heat treatment to simulate device fabrication on the wafers: firstly, at 800° C. for 4 hours in a nitrogen atmosphere and secondly, at 1000° C. for 16 hours in a dry oxygen atmosphere. Subsequent to this, presence or absence of slip dislocations and positions of an OSF ring region were confirmed by means of X-ray topography. The heat treatment at 1150° C. for one hour in an argon atmosphere was performed in conditions of a load/unload temperature of 850° C., a boat speed of 15 cm/min, a temperature rise rate of 10° C./min and a temperature fall rate of 5° C./min and the heat treatment to simulate device fabrication was performed such that after the heat treatment of 1000° C., the temperature was reduced down to 800° C. and thereafter, the wafers were taken out from the furnace. A quartz boat was used in the heat treatment. A position in which an OSF ring region occurred were confirmed by judging a pattern of oxygen precipitation since the oxygen precipitation is harder to occur in the OSF ring region than the other regions. Results thereof were shown as a schematic drawing in FIG. 2(*a*). No slip dislocation was observed as shown in FIG. 2(*a*). Note that the OSF ring region was formed in an annular region with a width a little less than 10 mm from the periphery of a wafer.

EXAMPLE 2

With the pulling apparatus 30 shown in FIG. 5, a starting material polycrystalline silicon was charged in a 20 inch quartz crucible to pull a p-type silicon single crystal rod with a <100> orientation and a diameter of 6 inches without doping nitrogen. In this case, a F/G value in the central portion of the crystal is controlled in the range of 0.18 to 0.22 mm$^2$/° C.·min to form an OFS ring region in an annular region with a width of about 10 mm or less from the periphery of the crystal.

Wafers were cut from the single crystal obtained here and an ordinary wafer process was applied to prepare mirror polished wafers. The same heat treatment as in Example 1 was applied to the thus obtained mirror polished wafers to perform observation by means of X-ray topography. Results thereof are described in FIG. 2(*b*).

As a result, it was found that slip dislocations of a length of about 7 mm occurred from a contact portion with a boat. A wafer after the observation by means of X-ray topography was etched by a fluoric acid and nitric acid based preferential etching liquid and thereafter, the wafer was observed on a surface to confirm presence or absence of pits corresponding to slip dislocations by means of an optical microscope with the result that no pit of slip dislocations was observed and it was confirmed that no slip dislocation extended up to a surface of the wafer. Note that an OSF ring region was formed in an annular region with a width a little less than 10 mm from the periphery of the wafer.

COMPARATIVE EXAMPLE 1

With the pulling apparatus 30 shown in FIG. 5, a starting material polycrystalline silicon was charged in a 20 inch quartz crucible to pull a p-type silicon single crystal rod with a <100> orientation and a diameter of 6 inches without doping nitrogen. In this case, the single crystal was pulled at a growth rate F of about 1.6 mm/min in a condition where no OFS ring region was formed.

Wafers were cut from the single crystal obtained here and an ordinary wafer process was applied to prepare mirror polished wafers. The same heat treatment as in Example 1 was applied to the thus obtained wafers to perform observation by means of X-ray topography. Results thereof are described in FIG. 2(*c*).

As a result, it was found that slip dislocations of a length of about 15 mm occurred from a contact portion with a boat. A wafer was etched by a preferential etching liquid as in Example 2 and thereafter, the wafer was observed on a surface by means of an optical microscope with the result that pits of slip dislocations were observed and it was confirmed that slip dislocations extended up to a surface of the wafer.

It is found from the results of FIG. 2 that if a wafer has a contact portion formed of an OSF ring region between the wafer and a boat, perfectly no slip dislocation occurs or at least growth of slip dislocations can be suppressed even when the wafer is subjected to high temperature heat treatment in which slip dislocations are easily generated.

EXAMPLES 3 AND 4, COMPARATIVE EXAMPLE 3

Mirror polished wafers obtained from the same silicon single crystals used in Examples 1 and 2, and Comparative Example 1, respectively, were used to perform heat treatment in a horizontal furnace. Heat treatment was performed similar to that of Example 1: heat treatment on the wafers in an argon atmosphere at 1150° C. for one hour, followed by further heat treatment to simulate device fabrication on the wafers: firstly, at 800° C. for 4 hours in a nitrogen atmosphere and secondly, at 1000° C. for 16 hours in a dry oxygen atmosphere. The heat treatment at 1150° C. for one hour in an argon atmosphere was performed in conditions of a load/unload temperature of 950° C., a boat speed of 15 cm/min, a temperature rise rate of 6° C./min and a temperature fall rate of 3° C./min and the heat treatment to simulate device fabrication was performed such that after the heat treatment of 1000° C., the temperature was reduced down to 800° C. and thereafter, the wafers were taken out from the furnace. A quartz boat was used in the heat treatment.

Presence or absence of slip dislocations in wafers having been subjected to the heat treatment and positions of OSF ring regions thereon were confirmed by X-ray topography.

No slip dislocation was observed on wafers prepared from the same silicon single crystal as used in Example 1.

Slip dislocations of a length of about 4 mm were generated from a contact portion with a boat on a wafer (Example 4) prepared from the same single crystal as used in Example 2. However, preferential etching was performed on a wafer as in Example 2 and a wafer surface thus etched was observed by means of an optical microscope, with the result that while some pits were present in the vicinity of a contact portion with a boat, no pit corresponding to slip dislocations was observed in the inner surface of a annular region with a width of 2 mm from the periphery and further, the effect of suppressing growth of slip dislocations by an OSF ring region was confirmed. Note that on wafers of Examples 3 and 4, OSF ring regions were formed in annular regions each with a width a little less than 10 mm from the periphery of the wafers.

In wafers (Comparative Example 2) prepared from the same single crystal as used in Comparative Example 1, slip dislocations of a length of about 20 mm from a contact portion with a boat were generated. Preferential etching was performed similar to Example 2 to observe a wafer surface with an optical microscope and as a result, pits corresponding to slip dislocations were observed in a portion in which slip dislocations had been observed by means of X ray topography.

CAPABILITY OF EXPLOITATION IN INDUSTRY

According to the invention, there can be suppressed slip dislocations which easily occur in a contact portion between a boat and a silicon single crystal wafer which is subjected to a variety of heat treatment steps with a simple and convenient method and in addition, since no need arises to increase processing loss and the number of steps, a silicon single crystal wafer with high slip resistance can be provided at a low cost and thereby, a value in terms of industrial applicability is great.

What is claimed is:

1. A silicon single crystal wafer which is a wafer prepared by means of a Czochralski method, the silicon single crystal wafer comprising at least one portion formed of an OSF ring portion in a peripheral region of the silicon single crystal wafer in contact with a boat on which the silicon single crystal wafer is placed for heat treatment.

2. A silicon single crystal wafer according to claim 1, wherein the OSF ring region is an annular region with a width of 10 mm or less from a periphery of the silicon single crystal wafer.

3. A silicon single crystal wafer according to claim 1, wherein a nitrogen concentration in the silicon single crystal wafer is in the range of $1\times10^{10}$ to $5\times10^{15}/cm^3$.

4. A silicon single crystal wafer according to claim 2, wherein a nitrogen concentration in the silicon single crystal wafer is in the range of $1\times10^{10}$ to $5\times10^{15}/cm^3$.

5. A manufacturing process for a silicon single crystal wafer comprising the steps of:

growing a silicon single crystal rod by means of a Czochralski method in a condition that an OSF ring region is formed in a peripheral region of the silicon single crystal rod; and slicing the grown silicon single crystal rod into silicon single crystal wafers, wherein the silicon single crystal wafer comprises at least one portion formed of the OSF ring portion in contact with a boat on which the silicon single crystal wafer is placed for heat treatment.

6. A manufacturing process for a silicon single crystal wafer according to claim 5, wherein a condition under which the OSF ring region is formed in a peripheral region of the silicon single crystal rod is such that when a pulling rate is indicated by F and an average temperature gradient in a pulling direction in a length between points corresponding to a silicon melting point and 1400° C. in the crystal is indicated by G by definition, there is present in a peripheral region of the crystal, an OSF ring region of a defect distribution chart which shows defect distribution, with an abscissa representing a distance in a direction to the crystal periphery from the center and an ordinate representing a value of F/G.

7. A manufacturing process for a silicon single crystal wafer according to claim 5, wherein when a silicon single crystal rod is grown by means of the Czochralski method, the silicon single crystal rod is pulled while doping the silicon single crystal rod with nitrogen at a concentration in the range of $1\times10^{10}$ to $5\times10^{15}/cm^3$.

8. A manufacturing process for a silicon single crystal wafer according to claim 6, wherein when a silicon single crystal rod is grown by means of the Czochralski method, the silicon single crystal rod is pulled while doping the silicon single crystal rod with nitrogen at a concentration in the range of $1\times10^{10}$ to $5\times10^{15}/cm^3$.

* * * * *